(12) United States Patent
Stojetz et al.

(10) Patent No.: US 10,361,534 B2
(45) Date of Patent: Jul. 23, 2019

(54) SEMICONDUCTOR LIGHT SOURCE

(71) Applicant: OSRAM Opto Semiconductors GmbH, Regensburg (DE)

(72) Inventors: Bernhard Stojetz, Wiesent (DE); Alfred Lell, Maxhütte-Haidhof (DE); Christoph Eichler, Donaustauf (DE); Andreas Löffler, Neutraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/069,674

(22) PCT Filed: Feb. 23, 2017

(86) PCT No.: PCT/EP2017/054222
§ 371 (c)(1),
(2) Date: Jul. 12, 2018

(87) PCT Pub. No.: WO2017/157638
PCT Pub. Date: Sep. 21, 2017

(65) Prior Publication Data
US 2019/0013642 A1    Jan. 10, 2019

(30) Foreign Application Priority Data
Mar. 14, 2016 (DE) .......... 10 2016 104 602

(51) Int. Cl.
*H01S 5/022* (2006.01)
*G02B 26/00* (2006.01)
(Continued)

(52) U.S. Cl.
CPC .......... *H01S 5/02292* (2013.01); *G02B 26/00* (2013.01); *H01S 3/0071* (2013.01);
(Continued)

(58) Field of Classification Search
CPC ............... H01S 5/02292; H01S 5/4087; H01S 5/32341; H01S 5/026; H01S 5/4031; H01S 5/02212; H01S 3/0071; H01S 5/02296; H01S 5/02248; H01S 3/005; H01S 5/4056; G02B 26/00
See application file for complete search history.

(56) References Cited

U.S. PATENT DOCUMENTS

| 5,003,550 A | 3/1991 | Welch et al. |
|---|---|---|
| 6,350,041 B1 | 2/2002 | Tarsa et al. |

(Continued)

FOREIGN PATENT DOCUMENTS

| DE | 102007019688 A1 | 10/2008 |
|---|---|---|
| DE | 102009012224 A1 | 12/2009 |

(Continued)

*Primary Examiner* — Xinning(Tom) Niu
(74) *Attorney, Agent, or Firm* — Slater Matsil, LLP

(57) ABSTRACT

A semiconductor light source is disclosed. In an embodiment a semiconductor light source includes at least one semiconductor laser configured to generate a primary radiation and at least one coupling-out element comprising a continuous base region and rigid light guide columns extending away from the base region, the light guide columns acting as waveguides for the primary radiation, wherein the primary radiation is irradiated into the base region during operation, is led through the base region to the light guide columns and is directionally emitted from the light guide columns so that an intensity half-value angle of the emitted primary radiation is at most 90°.

18 Claims, 8 Drawing Sheets

(51) Int. Cl.
H01S 5/323 (2006.01)
H01S 3/00 (2006.01)
H01S 5/026 (2006.01)
H01S 5/40 (2006.01)

(52) U.S. Cl.
CPC .......... H01S 5/026 (2013.01); H01S 5/02296 (2013.01); H01S 5/32341 (2013.01); H01S 5/4031 (2013.01); H01S 5/4087 (2013.01); H01S 3/005 (2013.01); H01S 5/02212 (2013.01); H01S 5/02248 (2013.01); H01S 5/4056 (2013.01)

(56) References Cited

U.S. PATENT DOCUMENTS

| | | | |
|---|---|---|---|
| 6,735,234 B1* | 5/2004 | Paschotta | H01S 5/141 372/10 |
| 2004/0105480 A1* | 6/2004 | Sidorin | H01S 5/141 372/97 |
| 2006/0002443 A1* | 1/2006 | Farber | H01S 5/141 372/50.1 |
| 2009/0072255 A1* | 3/2009 | Takahashi | C09K 11/584 257/98 |
| 2011/0052114 A1* | 3/2011 | Bernasconi | H01S 5/026 385/3 |
| 2011/0158272 A1 | 6/2011 | Pezeshki | |
| 2014/0240509 A1 | 8/2014 | Nakayama | |
| 2014/0313767 A1 | 10/2014 | Lin | |

FOREIGN PATENT DOCUMENTS

| | | |
|---|---|---|
| DE | 102010012745 A1 | 9/2011 |
| DE | 102010042611 A1 | 4/2012 |
| EP | 2549330 A1 | 1/2013 |

\* cited by examiner

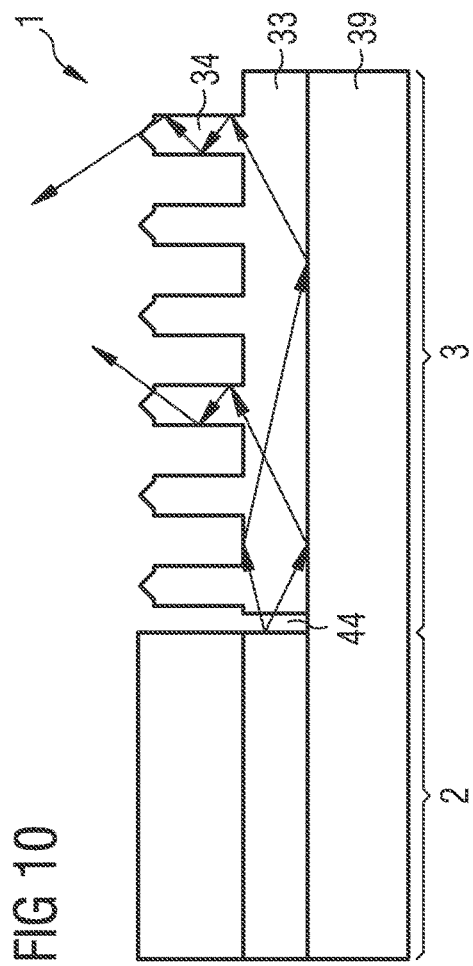
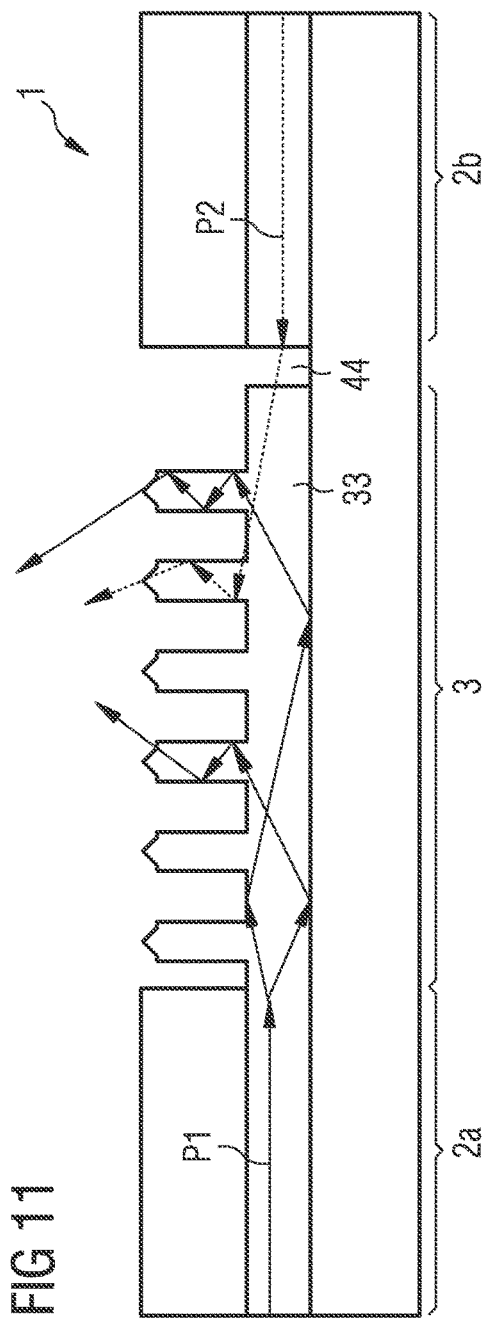

FIG 12
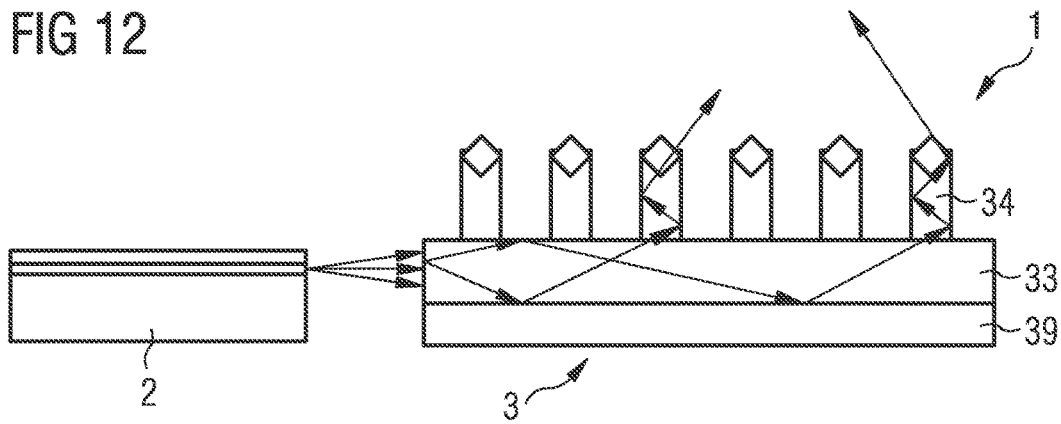
FIG 13
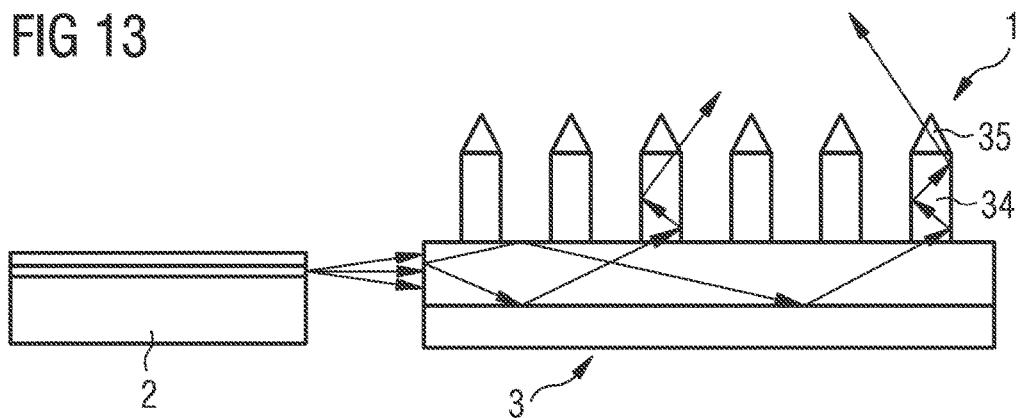
FIG 14A    FIG 14B    FIG 14C    FIG 14D
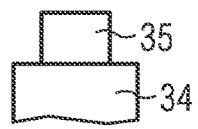 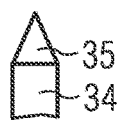 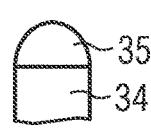 
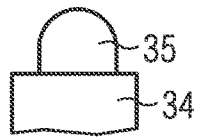 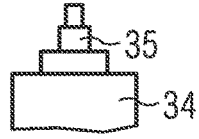 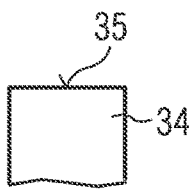 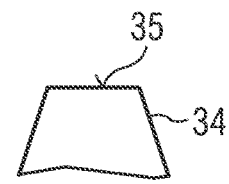
FIG 14E    FIG 14F    FIG 14G    FIG 14H

SEMICONDUCTOR LIGHT SOURCE

This patent application is a national phase filing under section 371 of PCT/EP2017/054222, filed Feb. 23, 2017, which claims the priority of German patent application 10 2016 104 602.7, filed Mar. 14, 2016, each of which is incorporated herein by reference in its entirety.

TECHNICAL FIELD

A semiconductor light source is specified.

SUMMARY OF THE INVENTION

Embodiments provide a semiconductor light source which emits efficiently into a specific spatial region.

According to at least one embodiment, the semiconductor light source comprises one or more semiconductor lasers for generating a primary radiation. In particular, the semiconductor light source comprises exactly one semiconductor laser.

According to at least one embodiment, the primary radiation, which is generated by the at least one semiconductor laser during operation, is ultraviolet radiation or visible light. For example, a wavelength of maximum intensity is at least 250 nm or 320 nm or 360 nm or 400 nm or 440 nm and/or at most 570 nm or 535 nm or 525 nm or 490 nm or 420 nm. In particular, the wavelength of maximum intensity of the primary radiation is 375 nm or 405 nm or 450 nm, in each case with a tolerance of at most 10 nm.

According to at least one embodiment, the semiconductor light source comprises a coupling-out element. The coupling-out element is designed, in particular, to lead away and/or to emit a radiation generated in the semiconductor light source from the latter.

According to at least one embodiment, the coupling-out element has a base region. The base region is preferably a continuous, contiguous, uninterrupted region.

According to at least one embodiment, the coupling-out element comprises a plurality of light guide columns. The light guide columns extend in the direction away from the base region. The light guide columns are designed as waveguides for the primary radiation. The light guide columns are preferably mechanically rigid, so that the light guide columns do not deform or not significantly deform in the intended use of the semiconductor light source.

According to at least one embodiment, the primary radiation is irradiated into the base region during operation, in particular coming directly from the semiconductor laser into the base region. The primary radiation is thus guided through the base region to the light guide columns. Preferably, therefore, no primary radiation is coupled directly into the light guide columns. The base region can function as a waveguide for the primary radiation towards the light guide columns.

According to at least one embodiment, the primary radiation is emitted directionally from the light guide columns. The light guide columns can be the element of the semiconductor light source from which the light leaves the semiconductor light source. Alternatively, a further component of the semiconductor light source is arranged downstream of the light guide columns, wherein said further component can form an optical termination of the semiconductor light source towards the outside.

According to at least one embodiment, an intensity half-value angle of the emitted light, in particular of the primary radiation, is at most 90° or 60° or 40° or 30° or 20°. The intensity half-value angle is the angular range within which a direction-dependent intensity is at least 50% of a maximum intensity. The intensity half-value angle can be referred to as the FWHM angle with respect to the intensity. Thus, a light emission by the semiconductor light source is significantly more directed than would be the case with a Lambertian emitter, whose intensity half-value angle is 120°.

In at least one embodiment, the semiconductor light source comprises at least one semiconductor laser for generating a primary radiation and at least one coupling-out element. The coupling-out element comprises a continuous base region and rigid light guide columns extending away from the base region. The light guide columns act as waveguides for the primary radiation. The primary radiation is irradiated into the base region by the semiconductor laser during operation, passes through the base region to the light guide columns and is radiated away from the light guide columns. In this case, an intensity half-value angle of the emitted light and/or of the emitted primary radiation is at most 40°.

High-efficiency, scalable light sources of high luminance and having a directional emission characteristic represent key components for highly growing markets, for example, in projection devices or for headlights, in particular with high range. Light sources based on light-emitting diodes, e.g., LEDs, reach their limits in particular with regard to luminance. Conventional laser-based light sources, however, have very high luminance densities, but show little flexibility with regard to their scalability. In addition, the usually highly divergent emission, even with differently divergent emission in different directions, requires a high effort with regard to the optics used. In contrast, semiconductor lasers can be used in the semiconductor light source described here, the emission characteristic of which can be flexibly designed by the coupling-out element.

In the case of the semiconductor light source described here, for example, the laser light of an InGaN laser is coupled into the coupling-out element, for example, into a lateral chip flank of an InGaN-sapphire chip. Said chip contains a waveguide, in particular in the form of the base region, and an output structure, in particular in the form of the light guide columns. The laser light is distributed through the base region onto the light guide columns and is emitted directionally from the light guide columns. By changing the base region and the light guide columns, a scalable, highly efficient semiconductor light source with directional emission characteristics and, when using phosphors, with freely selectable emission color can thus be implemented. In this case, the semiconductor laser and the coupling-out element can be optimized largely independently of one another with regard to the desired properties. Due to the coupling-out element, no complex optics are required, and the adjustment effort can also be reduced compared to conventional optics.

According to at least one embodiment, a main emission direction of the semiconductor light source is oriented perpendicular to a longitudinal axis of the base region. Alternatively or additionally, the main emission direction is oriented parallel to longitudinal axes of the light guide columns. The light guide columns are preferably straight in each case, so that the light guide columns have no or only negligible curvatures in the direction away from the base region. The directions mentioned here and in the following, such as parallel or perpendicular, preferably each apply with a tolerance of at most 15° or 10° or 5° or 1°.

According to at least one embodiment, the light guide columns are oriented perpendicular to the base region. In this case, a light-guiding direction in the light guide columns is effected, for example, perpendicular or also parallel to a light guidance in the base region, dependent on the direction of incidence of the primary radiation.

According to at least one embodiment, the light guide columns are oriented obliquely to the base region. For example, an angle or an average angle between the longitudinal axis of the base region and the longitudinal axes of the light guide columns is at least 25° or 35° or 45° and/or at most 75° or 65° or 55°. By means of such light guide columns, a main emission direction of the semiconductor light source can be reached which is oblique to the base region and/or oblique to the irradiation direction of the primary radiation.

According to at least one embodiment, the light guide columns all have the same length, preferably with a tolerance of at most 25% or 10% of a mean length of the light guide columns. In other words, no light guide columns of different lengths are then present. Alternatively, the light guide columns can have different lengths in a targeted manner. For example, the emission angle range and/or the emitted color can be adjusted via the length of the light guide columns.

According to at least one embodiment, the primary radiation is irradiated parallel to the longitudinal axis of the base region. In this case, the primary radiation is preferably deflected by 90° through the light guide columns, so that the main emission direction is oriented perpendicular to an irradiation direction of the primary radiation into the base region. The direction of irradiation is that direction along which the primary radiation passes from the semiconductor laser to the coupling-out element.

According to at least one embodiment, the primary radiation is irradiated parallel to the longitudinal axes of the light guide columns and also radiated out of the light guide columns along the same direction. In other words, the irradiation direction of the primary radiation is then oriented perpendicular to the longitudinal axis of the base region. The primary radiation then passes through the base region approximately perpendicularly.

According to at least one embodiment, the base region is plate-shaped. This can mean that a thickness of the base region is at most 10% or 5% or 1% of a mean width and/or length of the base region. In other words, the base region is comparatively thin, relative to its lateral dimensions.

According to at least one embodiment, the base region is shaped as a rod, for example, as a cylinder. A length of the rod is preferably at least by a factor of 5 or 10 or 20 or 100 above a mean diameter. The rod can be designed, for example, as a truncated cone with a diameter which decreases in the direction away from the semiconductor laser.

According to at least one embodiment, the light guide columns are arranged around the longitudinal axis of the base region. This preferably applies to an angular region around the base region, viewed in cross section, of at least 60° or 90° or 150°, preferably completely around the base region, viewed in cross-section, and thus for an angular range of 360°. In other words, the light guide columns can project radially from the base region in different directions, approximately similar to the bristles of a bottle cleaning brush. In this case, the light guide columns can be present all around or only in certain angular ranges.

According to at least one embodiment, a roughening is formed on a bottom face of the base region facing away from the light guide columns. The roughening is configured to scatter the primary radiation. Structural sizes of the roughening are in particular in the order of magnitude of a wavelength of the primary radiation, for example, at least 0.5 µm or 0.3 µm and/or at most 7 µm or 4 µm. Alternatively or additionally, the structure sizes of the roughening and/or of the light guide columns can be at least 50 nm or 200 nm or 1 µm and/or at most 10 µm or 2.5 µm or 0.6 µm.

According to at least one embodiment, a structural density of the roughening increases in the direction away from the at least one semiconductor laser, in particular monotonically or strictly monotonically. If a plurality of the semiconductor lasers are present, this preferably applies to each of the semiconductor lasers. By varying the structure density of the roughening, a uniform luminance can be achieved across the semiconductor light source. Alternatively, the roughening can be produced invariably and without a targeted variation and/or can extend homogeneously over the entire bottom face.

According to at least one embodiment, the light guide columns each have tips. An emission of the primary radiation from the light guide columns is preferably effected to at least 50% or 70% or 85% or exclusively from the tips. Thus, regions between adjacent light guide columns, in particular sections between the tips and the base region, appear dark or significantly darker in comparison to the tips.

According to at least one embodiment, the tips of the light guide columns extend in the direction away from the base region. In particular, the tips, viewed in cross section, are shaped like a trapezoid, a triangle, a semi-circle, a stepped pyramid, a parabola or a hyperbola. As a result, it is possible for the tips to have an effect similar to a converging lens for the primary radiation, so that a particularly directed emission from the light guide columns can be achieved. Alternatively, it is possible for the tips to be flat, so that the light guide columns, viewed in cross section, can be designed like a rectangle or also as a trapezoid. The tips are preferably shaped as pyramids, in particular as hexagonal and/or regular pyramids.

According to at least one embodiment, a region between the light guide columns is partially or completely filled with at least one liquid or solid material. This material has a lower refractive index, in particular for the primary radiation, than the light guide columns themselves. For example, the refractive index difference at the wavelength of the primary radiation is at least 0.01 or 0.02 or 0.1 or 0.2 or 0.3. As a result, it is possible that said material serves as a cladding layer for the light guide columns, which have a larger refractive index. In other words, the light guide columns are constructed together with the cladding layer in a manner similar to a waveguide such as a glass fiber.

According to at least one embodiment, a material having a relatively low refractive index, compared to a refractive index of the base region itself, is located in places on the base region. In this way, a wave guidance due to total reflection, such as in a glass fiber, can be achieved in the base region. Alternatively or additionally, it is possible for the base region to be provided in places with a mirror, for example, with a metallic mirror or a Bragg mirror. As a result, efficient guidance of the primary radiation from the base region to the light guide columns is possible.

According to at least one embodiment, the base region and the light guide columns consist of the same material. For example, the base region and the light guide columns are formed from a semiconductor material and grown epitaxially as a semiconductor layer sequence.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or as $Al_nGa_mIn_{1-n-m}As_kP_{1-k}$, wherein in each case $0 \leq n \leq 1$, $0 \leq m \leq 1$ and $n+m \leq 1$ and $0 \leq k \leq 1$, wherein the material system AlInGaN is preferred. In particular, for at least one layer or for all layers of the semiconductor layer sequence $0<n \leq 0.8$, $0.4 \leq m<1$ and $n+m \leq 0.95$ as well as $0<k \leq 0.5$ apply; especially for the material system AlInGaN it applies that $0<n \leq 0.9$ and $1-n-m \leq 0.25$. The semiconductor layer sequence can have dopants and additional components. For the sake of simplicity, however, only the essential components of the crystal lattice of the semiconductor layer sequence, that is Al, As, Ga, In, N or P, are mentioned, even if these can be partially replaced and/or supplemented by small quantities of further substances.

According to at least one embodiment, the base region and the light guide columns are formed from different materials. For example, the base region can serve as a light-transmissive growth substrate for the light guide columns. For example, the base region is then formed of sapphire and the light guide columns are formed of a semiconductor material such as $Al_nIn_mGa_{1-n-m}N$ with $0 \leq n$ and/or $m \leq 1$.

According to at least one embodiment, the base region and/or the light guide columns are formed from one or more of the following materials or comprise one or more of these materials: sapphire, glass, polycarbonate, polymethyl methacrylate, crystalline polystyrene, polyethylene terephthalate, epoxy resin.

According to at least one embodiment, the coupling-out element consists of one or more semiconductor materials. For example, a semiconductor material for the base region and another semiconductor material for the light guide columns are provided. In particular, the base region can be composed of a semiconductor growth substrate such as SiC or GaAs or GaN, which is transmissive to the laser radiation generated, depending on the wavelength produced, and the light guide columns are, for example, grown onto the semiconductor growth substrate from another material. For example, the light guide columns are made of GaN or AlGaN or InGaP or AlGaP or InGaAs or AlGaAs or ZnS or ZnSe, in particular in the case of light guide columns which are grown on the base region. A combination of SiC for the base region and GaN for the light guide columns is preferred.

According to at least one embodiment, the coupling-out element is made of the same semiconductor material as a semiconductor layer sequence of the semiconductor laser or is based thereon. For example, the coupling-out element and the semiconductor layer sequence are preferably formed of $Al_nIn_{1-n-m}Ga_mN$ or alternatively also of $Al_nIn_{1-n-m}Ga_mP$ or $Al_nIn_{1-n-m}Ga_mAs$ or $Al_nGa_mIn_{1-n-m}As_kP_{1-k}$, wherein $0 \leq n \leq 1$, $0 \leq m \leq 1$ and $n+m \leq 1$ and $0 \leq k<1$. In this case, the base region and the light guide columns can have the same or different material compositions, within the same material system. In the case of the same material compositions, in particular GaN or AlGaN is used. In the case of different material compositions, in particular GaN and AlGaN are used.

According to at least one embodiment, the base region and the light guide columns are made in one piece. In this case, the base region and the light guide columns preferably consist of the same material. If the base region and the light guide columns are formed from different materials, the light guide columns thus start particularly preferably directly on the base region, so that there is direct contact and touch between the base region and the light guide columns, and there is no gap between the base region and the light guide columns.

According to at least one embodiment, the base region and the light guide columns have the same material only in part. For example, a further material is applied to the base region as a continuous layer, and then this layer is structured, for instance by means of etching, wherein said structuring extends into the base region and the light guide columns are produced by this structuring. In this case, a material of the base region, along the longitudinal axes of the light guide columns and proceeding from the remaining base region, constitutes, for example, at least 10% or 20% and/or at most 60% or 40% or 25% of the light guide columns.

According to at least one embodiment, the semiconductor laser and the coupling-out element are monolithically integrated. This can mean that the semiconductor laser and the coupling-out element are grown on the same growth substrate and are still located on the growth substrate. This can likewise mean that the semiconductor laser and the coupling-out element are formed from a contiguous semiconductor layer sequence.

According to at least one embodiment, the semiconductor laser and/or the light guide columns are formed epitaxially, grown in an organized manner and/or produced by etching. Furthermore, it is possible for the coupling-out element to be produced by injection molding or transfer molding, in particular when the coupling-out element is formed from a plastic.

According to at least one embodiment, the cladding layer, which is located on the light guide columns and/or on the base region, is formed from an oxide, nitride or oxynitride of at least one of the following metals or semiconductors: Al, Ce, Ga, Hf, In, Mg, Nb, Rh, Sb, Si, Sn, Ta, Ti, Zn, Zr, N, SiC. The cladding layer can be electrically conductive or also electrically insulating.

According to at least one embodiment, the semiconductor light source comprises a plurality of semiconductor lasers. In this case, the semiconductor lasers can be of the same construction or can also emit colors different from one another.

According to at least one embodiment, the semiconductor lasers have irradiation directions oriented obliquely or transversely to one another. In particular, the irradiation directions are not only parallel or antiparallel to one another, but different directions are present.

According to at least one embodiment, the irradiation directions of all semiconductor lasers lie in a common plane. In this way, it is possible for the coupling-out element to receive the different primary radiations from different directions. In this case, the coupling-out element can be designed to be flat and/or plate-shaped.

According to at least one embodiment, the coupling-out element and the semiconductor laser do not touch each other. This can mean that an intermediate region with a different material is present between the semiconductor laser and the coupling-out element. The intermediate region is, for example, gas-filled or evacuated or replaced by a light guide, such as a glass, a plastic, a dielectric and/or a semiconductor material.

According to at least one embodiment, the primary radiation is emitted by the semiconductor laser in an elliptical emission characteristic or elliptical angular distribution or also linearly. This can mean that an aspect ratio of a width and a length of the primary radiation, in particular in the optical far field, is at least 2 or 5 or 10 or 50. A uniform illumination of the semiconductor layer sequence of the conversion element can be achieved by such a line profile of the primary radiation.

According to at least one embodiment, the semiconductor laser is a so-called ridge waveguide, also referred to as a ridge laser. In this case, the semiconductor laser comprises at least one ridge, which is produced from a semiconductor layer sequence of the semiconductor laser and which serves as a waveguide for the primary radiation within the semiconductor laser. The semiconductor laser can also be designed as an oxide stripe laser or as a broad stripe laser.

According to at least one embodiment, the primary radiation passes from the semiconductor laser in a free-beam manner to the coupling-out element. This can mean that there is no optical element for the primary radiation between the coupling-out element and the semiconductor laser and/or that a region between the semiconductor laser and the coupling-out element is completely or predominantly filled with a gas or evacuated. Predominantly can mean that an optical path between the semiconductor laser and the coupling-out element is free of condensed matter to a degree of at least 50% or 70% or 90%.

According to at least one embodiment, the light guide columns have an average diameter of at least 0.5 µm or 0.7 µm or 1 µm. Alternatively or additionally, the average diameter is at most 10 µm or 4 µm or 3 µm. Thus, the light guide columns are preferably not a photonic crystal. The light guide columns differ from a photonic crystal in particular by their larger geometric dimensions and/or by an irregular or less regular arrangement.

According to at least one embodiment, a ratio of a mean height and the mean diameter of the light guide columns is at least 2 or 3 or 5 and/or at most 20 or 10 or 7 or 5. By such a ratio of height and diameter, the light guide columns can serve as waveguides for the primary radiation in the direction parallel to the main emission direction.

According to at least one embodiment, an emission surface of the semiconductor laser for the primary radiation is smaller by at least a factor of 10 or 100 or 1000 than an emission surface of the coupling-out element for the primary radiation. In other words, an enlargement of an emission surface, relative to the emission surface of the semiconductor laser, takes place in the coupling-out element.

According to at least one embodiment, the primary radiation is only partially or completely converted into a secondary radiation. This means, in particular, that a mixed radiation is emitted by the semiconductor light source, the mixed radiation being composed of the primary radiation and of the secondary radiation. A power proportion of the primary radiation in the mixed radiation is preferably at least 10% or 15% or 20% and/or at most 50% or 40% or 30%.

According to at least one embodiment, the semiconductor light source comprises one or more phosphors for converting the primary radiation into the secondary radiation. The phosphors specified in the publication EP 2 549 330 A1 or else quantum dots can be used as phosphors. The at least one phosphor is, for example, one or more of the following substances: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}:RE$, where x=halide, n or divalent element, d=three- or tetravalent element and RE=rare earth metals, such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped SiONs such as $(Ba,Sr,Ca)Si_2O_2N_2:Eu^{2+}$; SiAlONs, for example, from the system $Li_xM_yLn_zSi_{12-(m+n)}Al_{(m+n)}O_nN_{16-n}$; orthosilicates such as $(Ba,Sr,Ca,Mg)_2SiO_4:Eu^{2+}$.

According to at least one embodiment, the semiconductor light source is used in general lighting. The semiconductor light source can likewise serve as a headlight for vehicles or as a directional radiator, for example, in the illumination or lighting of business premises. The semiconductor light source can also be used in projectors.

BRIEF DESCRIPTION OF THE DRAWINGS

A semiconductor light source described here is explained in more detail below with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

In the Figures:

FIGS. 1 to 13, 15 and 16, and 19 to 21 show schematic sectional representations of exemplary embodiments of semiconductor light sources described here;

FIG. 14 shows schematic sectional representations of light guide columns for semiconductor light sources described here.

DETAILED DESCRIPTION OF ILLUSTRATIVE EMBODIMENTS

Figure 1:
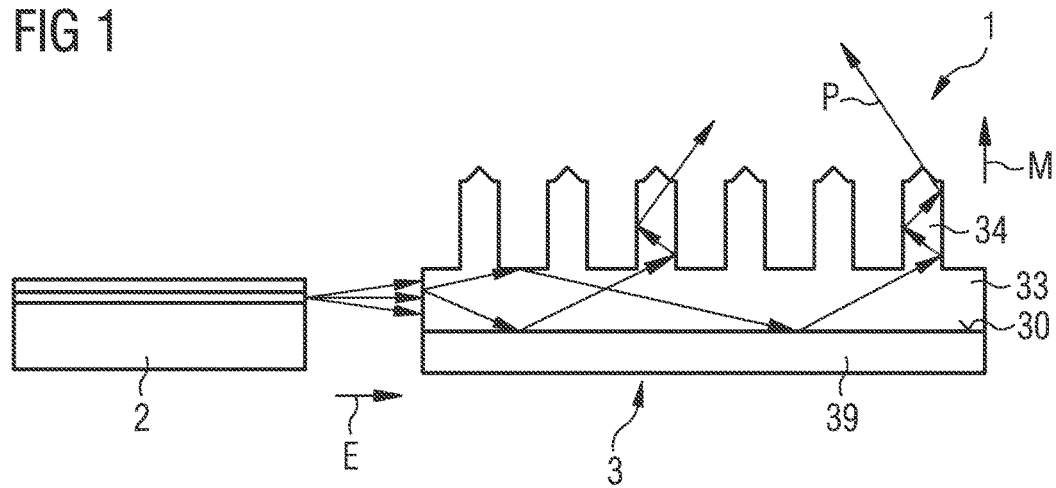

FIG. 1 shows an exemplary embodiment of a semiconductor light source 1. The semiconductor light source 1 comprises, as a light source, a semiconductor laser 2, which preferably emits blue light. The semiconductor laser 2 can likewise emit ultraviolet radiation, green light, yellow light, red light and/or infrared radiation.

Furthermore, the semiconductor light source comprises a coupling-out element 3, the coupling-out element 3 contains a flat, plate-shaped base region 33. Many light guide columns 34 originate from the base region 33. The light guide columns 34 have diameters in the range of a few µm and heights which are larger by about a factor of 5. Optionally, on a bottom face 30, facing away from the light guide columns 34, there is a cladding layer 39 consisting of a material having a lower refractive index for a wave guidance in the base region 33.

A primary radiation P emitted by the semiconductor laser 2 is irradiated into the coupling-out element along an irradiation direction E, which according to FIG. 1 is oriented parallel to a longitudinal axis of the base region 33. In the base layer 33, a wave guidance takes place in the direction parallel to the irradiation direction E. The primary radiation P reaches the light guide columns 34 via the base region 33 and is guided in the latter in the direction perpendicular to the irradiation direction E along a main emission direction M and is also emitted along the main emission direction M. In this case, the emission of the primary radiation P at the light guide columns 34 takes place in a directed manner, similar to a radiation coupling-out of glass fibers.

As a result of the generally good focusing capability of the laser light in the form of the primary radiation P, the primary radiation P can be efficiently coupled into the coupling-out element 3, even without optionally present optics. If an optical component is present between the semiconductor laser 2 and the coupling-out element 3, said optical component can thus be designed in a comparatively simple manner. The coupling-out element 3 is preferably designed to be flat. A size of a light-emitting surface of the semiconductor light source 1 can also be scaled and fixed by a size of the coupling-out element 3. By means of a geometry, in particular of the light guide columns 34, an emission characteristic can also be set independently of the semiconductor laser 2 and the optionally present optical component between the semiconductor laser 2 and the coupling-out element 3.

As in all other exemplary embodiments, it is possible that the base region 33 and the light guide columns 34 are produced in one piece from the same material, for example, by means of structuring spraying or by etching. By way of example, the base region 33 and the light guide columns 34 can be made of a semiconductor material such as SiC, a glass, a ceramic or a light-transmissive and preferably radiation-resistant plastic. A region between the light guide columns 34 is preferably filled with a gas, for example, an inert gas such as nitrogen or argon, or else filled with air.

Figure 2:
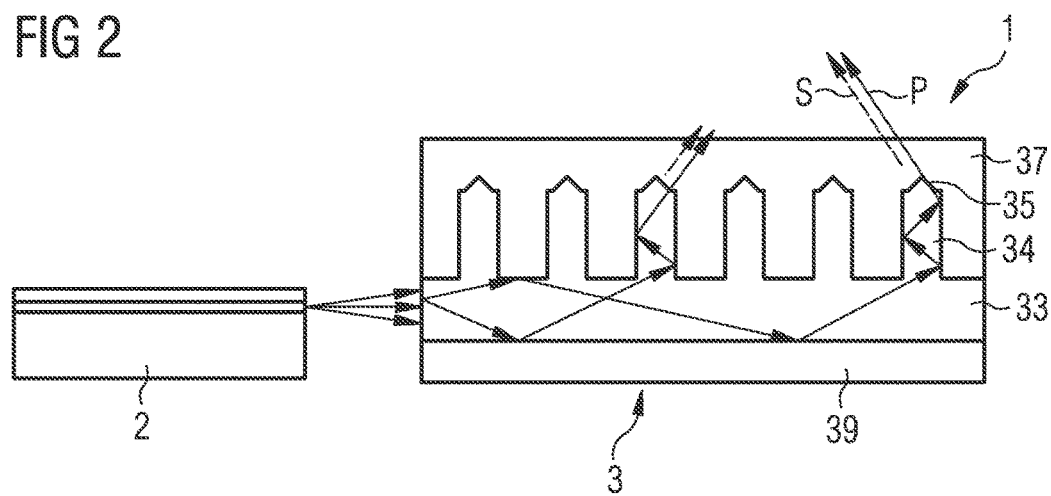

FIG. 2 illustrates a further exemplary embodiment of the semiconductor light source 1. In this case, the coupling-out element 3 additionally comprises a phosphor 37. The phosphor 37 is formed, for example, by a matrix material into which substances are embedded which convert the primary radiation into a longer-wave secondary radiation S. These substances can be, for example, inorganic phosphor particles, quantum dots or also organic phosphors.

FIG. 2 shows that the phosphor 37 is located above tips 35 of the light guide columns 34 and also completely fills intermediate regions between the light guide columns 34. In contrast to this, it is also possible for the phosphor 37 to be located only on and/or above the tips 35, so that intermediate spaces between the light guide columns 34 can be free of the phosphor 37. Furthermore, it is possible for the phosphor 37 to be arranged as a separate component at a distance from the coupling-out element 3. With the aid of the phosphor 37, light of different colors can be generated from the, for example, blue light of the primary radiation P; also white mixed light can be generated.

Figure 3:
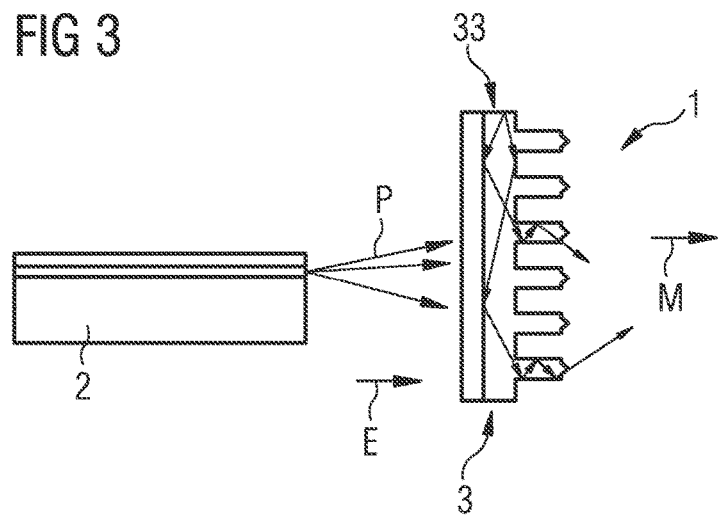

According to FIG. 3, the irradiation direction E and the main emission direction M are oriented parallel to one another. The primary radiation P is radiated perpendicularly to a longitudinal extent of the base region 33 into the coupling-out element 3. Optionally, it is possible that a more uniform light distribution takes place within the coupling-out element 3 in the direction perpendicular to the main emission direction M. Alternatively, the primary radiation P passes through the base region 3 in a substantially straight line. A side of the coupling-out element 3 facing the semiconductor laser 2 can be shaped convexly in a similar manner to a converging lens, in contrast to the drawing.

Figure 4:
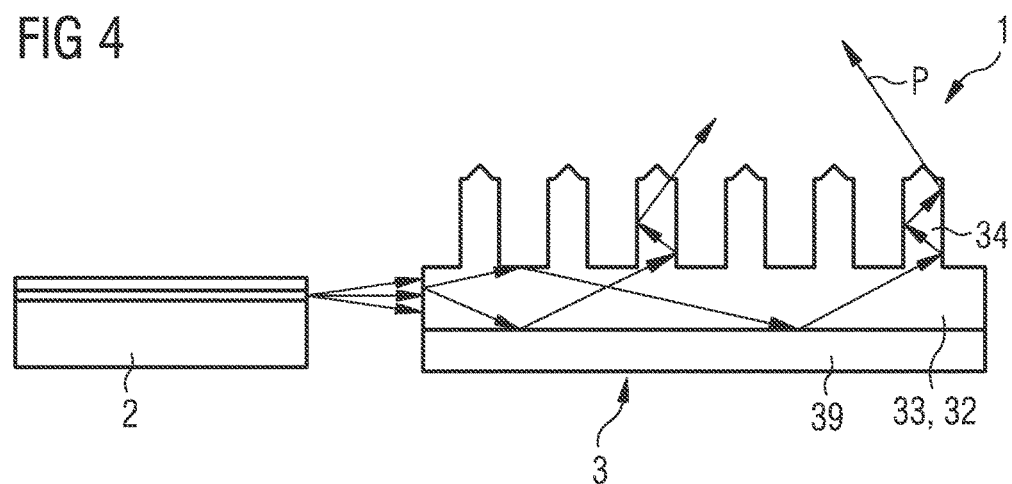

In the exemplary embodiment of FIG. 4, the coupling-out element 3 is formed, for example, by a chip based on InGaN; in particular, the coupling-out element 3 can be a chip which is similar to an LED chip, in which a semiconductor layer sequence is grown on a sapphire substrate. In this case, the cladding layer 39 can be formed, for example, by the sapphire substrate or another growth substrate having a low refractive index. The base region can be a growth layer and/or a nucleation layer on which the light guide columns 34 are grown. In this case, the base region 33 and the light guide columns 34 can be based on the same material system, but may have different material compositions.

In this case it is preferred, as is also possible in all other exemplary embodiments, that both the base region 33 and the light guide columns 34 are free of optically active structures, which bring about a wavelength change or a wavelength filtering. In other words, the base region 33 and the light guide columns 34 are then free of phosphors, conversion components and/or filter materials with regard to the primary radiation P.

Figure 5:
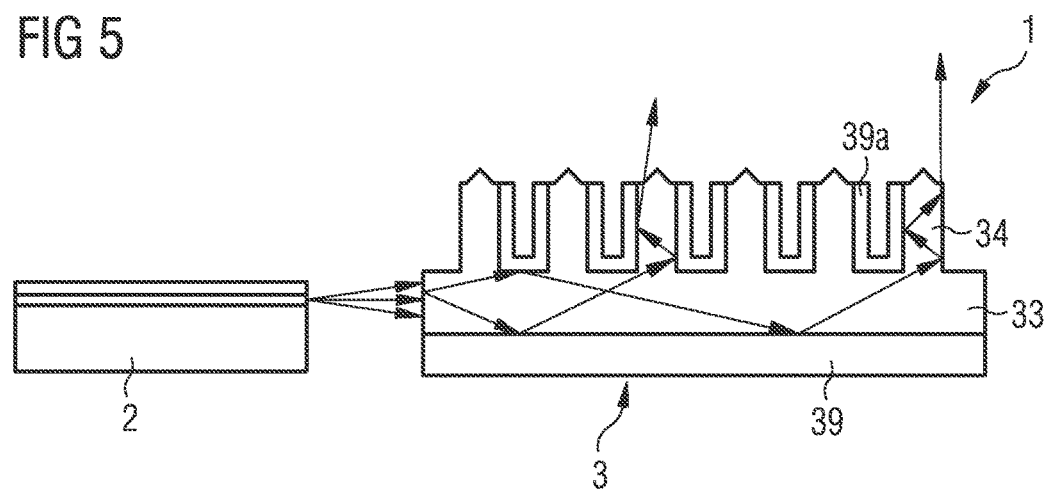

In FIG. 5, it is shown that on side faces of the light guide columns 34 and optionally also on regions of the base region 33 between the light guide columns 34, there is a further cladding layer 39a. By means of the further cladding layer 39a, a more efficient wave guidance can be achieved within the light guide columns 34 in the direction away from the base region 33.

In contrast to the illustration, it is possible that the further cladding layer 39a fills the regions between the light guide columns 34 completely and is not only applied as a relatively thin layer.

For example, for the cladding layer 39 and/or for the further cladding layer 39a, oxides, nitrides or oxynitrides of metals or semiconductors can be used. In particular by means of such cladding layers 39, 39a, a particularly directed emission along the main emission direction M can be achieved, even without the use of lenses. A corresponding semiconductor light source 1, in particular in combination with a phosphor 37, can be used as a white light source for directional radiating, for example, in headlights, in particular for motor vehicles.

Figure 6:
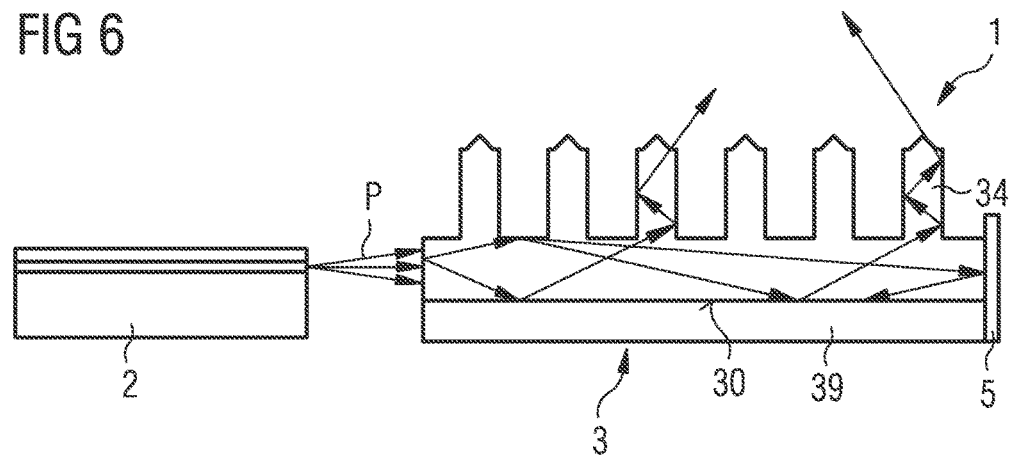

According to FIG. 6, a mirror 5 is located on a side of the coupling-out element 3 facing away from the semiconductor laser 2. The mirror 5 can be a metallic mirror, for instance based on silver or aluminum, or also a Bragg mirror having a plurality of alternating layers with different refractive indices. Such mirrors can alternatively or additionally be present on the bottom side 30 in addition to the cladding layer 39. It is also possible, in contrast to the drawing, that a mirror 5 partially covers a side of the coupling-out element 3 facing the semiconductor laser 2 so that only a light entrance opening for the primary radiation P is free of the mirror 5. One or more of the remaining side faces of the coupling-out element 3 can also be reflectorized.

Figure 7:
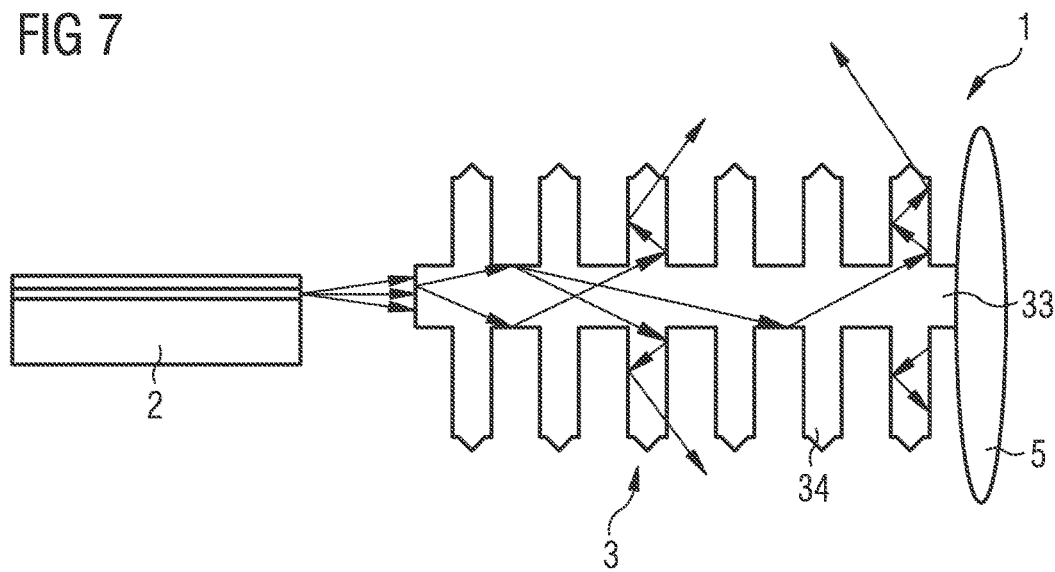

In the exemplary embodiments of FIGS. 1 to 6, the base region 33 and thus also the coupling-out element 3 are designed as a whole in a plate-shaped and planar fashion. In contrast, the base region 33 in the exemplary embodiment of FIG. 7 is formed as a round rod. The light guide columns 34 extend radially symmetrically away from the base region 33. An emission can thus be achieved all around, wherein the emission is directed in the direction perpendicular to the longitudinal axis of the base region 33. Optionally, the mirror 5 is present again.

Deviating from the representation in FIG. 7, it is also possible that the rod-shaped base region 33 is curved. As a result, other emission characteristics can be achieved.

It is also possible in FIGS. 1 to 6 with the plate-shaped base regions 33 that the light guide columns 34 are mounted on both sides of the base region 33, so that the primary radiation P and/or the secondary radiation S is radiated into two main emission directions M oriented antiparallel to one another.

Figure 8:
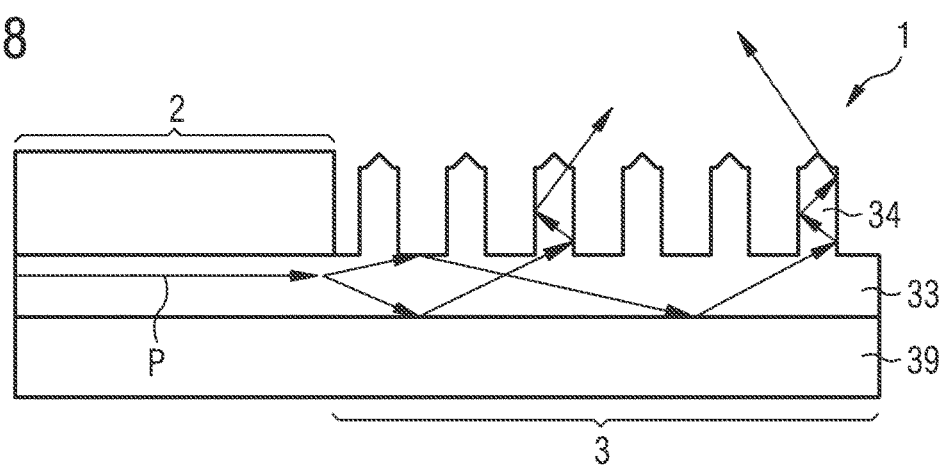

In the exemplary embodiment of FIG. 8, the semiconductor laser 2 and the coupling-out element 3 are monolithically integrated. For example, the semiconductor laser 2 and the coupling-out element 3 are arranged on the same substrate, which can be a growth substrate. In particular, it is possible for a waveguide of the semiconductor laser 2 to be contiguously continued in the coupling-out element 3, in particular in the base region 33. Such coupling-out elements 3, in particular the semiconductor columns 34, can be produced by etching and/or by subsequent application, for instance by epitaxial growth, and self-assembled growth is also possible.

Figure 9:
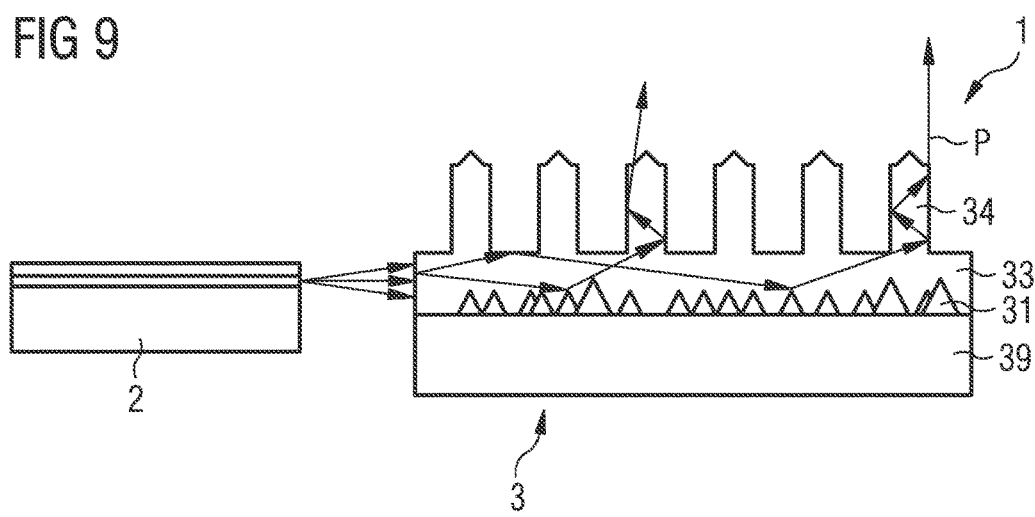

In the semiconductor light source 1 as shown in FIG. 9, the bottom face 30 of the base region 33 is provided with a roughening 31. A particularly uniform distribution of the primary radiation P across the coupling-out element 3 can be achieved by means of such a roughening 31. In this case, a gradient can be present in a structure density of the roughening 31.

In the exemplary embodiment of FIG. 10, as also shown in FIG. 8, the semiconductor laser 2 and the coupling-out element 3 are arranged on a common support which can serve as a cladding layer 39. However, a gap 44 is provided between the semiconductor laser 2 and the coupling-out element 3. As a result, a resonator of the semiconductor laser 2 can be optimized by, for example, reflecting layers in the gap 44. It is likewise possible for the coupling-out element 3 to be produced separately from the semiconductor laser 2 and to be applied to the support subsequently, in particular as a one-piece, finished component, for example, by adhesive bonding or soldering.

FIG. 11 shows that the semiconductor light source 1 comprises two semiconductor lasers 2a, 2b. The semiconductor lasers 2a, 2b emit primary radiations P1, P2 with different wavelengths. For example, the primary radiation P1 is blue light and the primary radiation P2 is red or yellow light, so that white light can result without the aid of phosphors.

According to FIG. 11, the semiconductor laser 2a is connected contiguously to the coupling-out element 3 and the gap 44 is located between the coupling-out element 3 and the semiconductor laser 2b. Deviating therefrom, a gap can also be present towards the semiconductor laser 2a, or the base region 33 touches both semiconductor lasers 2a, 2b.

In the exemplary embodiment of FIG. 12 it is shown that the base region 33 and the light guide columns 34 are produced from different materials. For example, the base region 33 is formed from sapphire and the light guide pillars 34 are made of silicon dioxide. Other materials can also be combined with one another, for example, glass as a mechanically stable layer for the base region 33 and plastics for the light guide columns 34.

FIG. 13 shows that the light guide columns 34 have comparatively tapered tips 35. Further forms of the tips 35 are shown in FIG. 14. Such tips 35 can also be used in all other exemplary embodiments, wherein a plurality of different tip types can be combined with one another within one coupling-out element 3.

According to FIG. 14A, the tip 35 is of rectangular design, seen in cross-section. In this case, the tip 35 has a smaller width than the remaining part of the light guide column 34. In FIG. 14B, the tip 35 is triangular when viewed in cross-section; according to FIG. 14C, a semicircular shape is present and, according to FIG. 14D, a trapezoidal shape. The tips 35 of FIG. 14B are thus preferably shaped as hexagonal, regular pyramids.

According to FIG. 14E, the tip 35 is parabolic and has a smaller diameter than remaining regions of the light guide column 34, such as can also apply correspondingly in FIG. 14B, 14C or 14D. Finally, see FIG. 14F, the tip 35 is designed as a stepped pyramid.

The light guide columns 34 of FIG. 14G are designed to be rectangular or, see FIG. 14H, also trapezoidal when viewed in cross section. The tips 35 are thus flat.

An average diameter of the light guide columns 34 is preferably at least $\lambda/4n$, wherein X is the wavelength of maximum intensity of the primary radiation P and n is the refractive index of the light guide columns 34. The diameter is preferably between $5\lambda/n$ and $10\lambda/n$. A typical diameter can also lie at approximately $2\lambda/n$. An aspect ratio of a diameter and a height of the light guide columns is preferably at most 1 or 0.5 or 0.2; for example, the wavelength of maximum intensity of the primary radiation is 405 nm or 450 nm or 500 nm.

Figure 15:
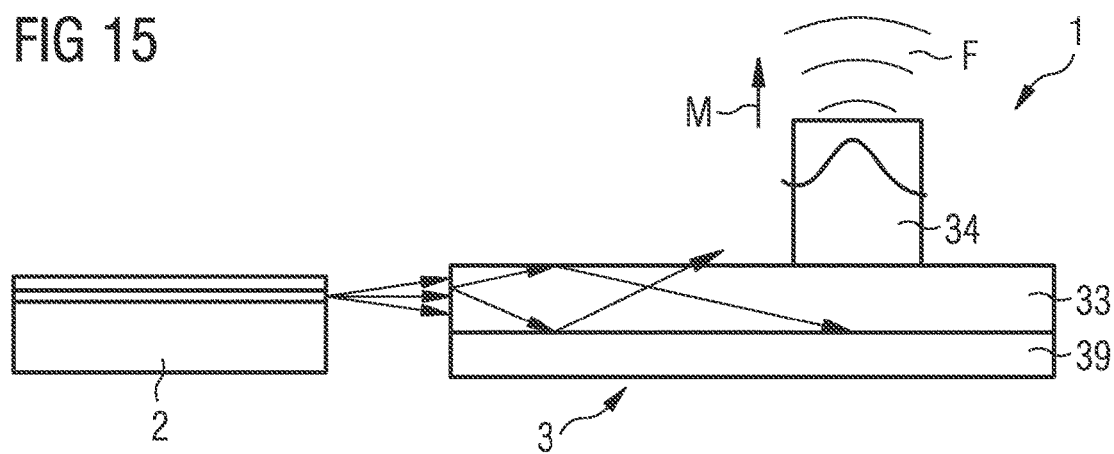

FIG. 15 illustrates a wave guidance within the light guide columns 34 and also a far field distribution based on wave fronts F. In order to simplify the illustration, only one of the light guide columns 34 is drawn in FIG. 15.

The light guide columns 34 are preferably shaped in such a way that an emission occurs with a numerical aperture, NA for short, of at most 0.3 or 0.25 or 0.2 or 0.15 and/or of at least 0.05 or 0.1 or 0.12. In other words, with such light guide columns 34 emission characteristics similar to that of optical fibers, in particular of glass fibers, can be achieved.

Figure 16:
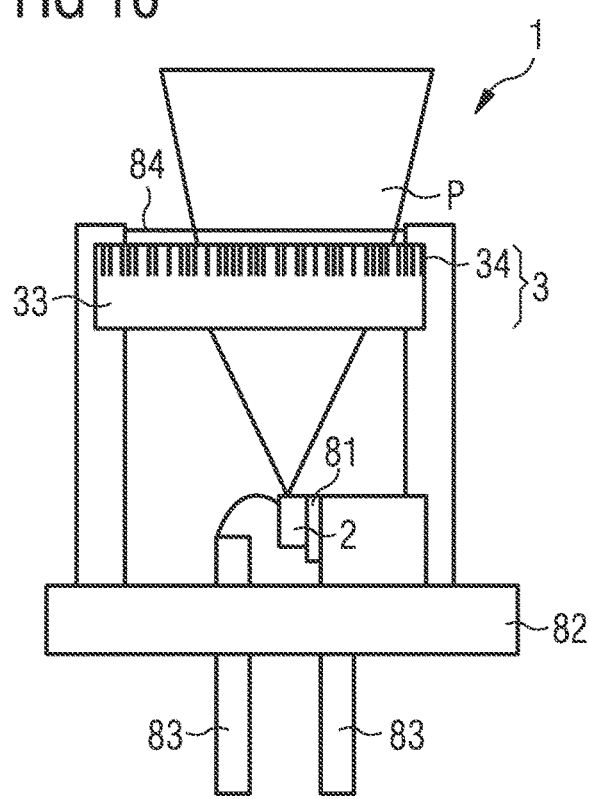

In the exemplary embodiment of FIG. 16, the coupling-out element 3 is irradiated, as shown in conjunction with FIG. 3. In this case, the semiconductor light source 1 is designed as a so-called TO housing so that the semiconductor laser 2 is seated on a heat sink 81 in a housing body 82. Electrical connections 83 are guided outwards through the housing body 82. A light exit window 84 is optionally located on a side of the coupling-out element 3 facing away from the semiconductor laser 2.

Figure 17:
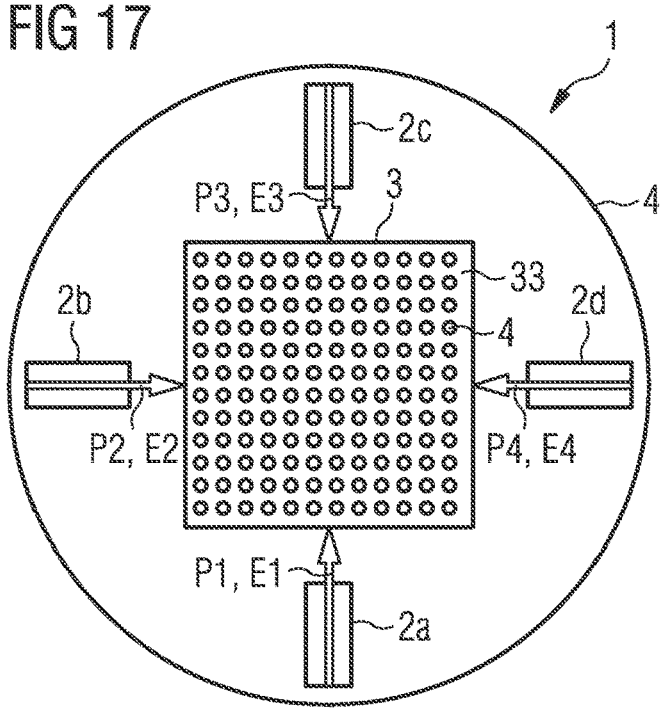
FIGS. 17 and 18 show schematic plan views of exemplary embodiments of semiconductor light sources described here.
Figure 18:
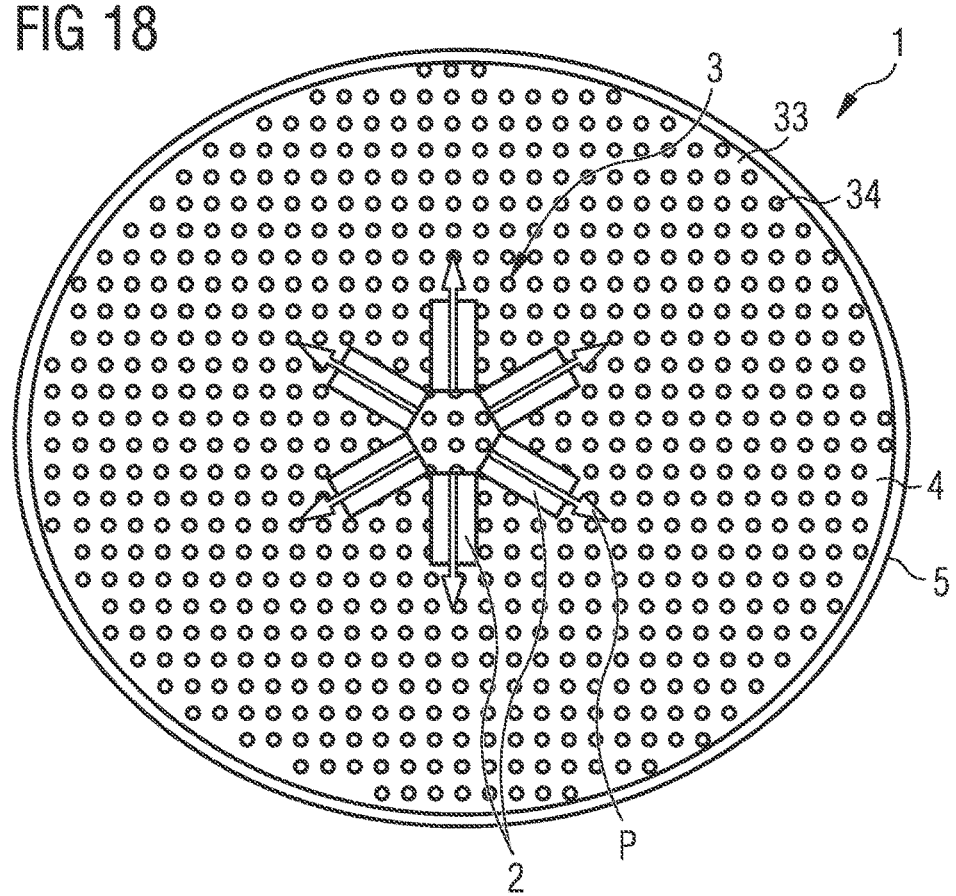

FIGS. 17 and 18 show arrangement possibilities in which the semiconductor light source 1 comprises a plurality of the semiconductor lasers. In FIG. 17, it is shown that the coupling-out element 3 lies centrally on a support 4 and that several, in particular four of the semiconductor lasers are arranged around the coupling-out element 3. In this case, the semiconductor lasers can be arranged at right angles to one another and can irradiate primary radiation of different colors into the coupling-out element 3.

According to FIG. 18, on the other hand, the semiconductor lasers 2 are located at a center of the support 4 and the coupling-out element 3 extends around the semiconductor lasers 2. In this case, a mirror 5 can be provided all around. In this embodiment, too, the semiconductor lasers 2 can emit primary radiations P of different colors.

The support 4 of FIGS. 17 and 18 can be a wafer, on which the semiconductor laser 2 and/or the coupling-out element 3 are monolithically grown and/or produced. Alternatively, the semiconductor lasers 2 and the coupling-out element 3 are produced independently of one another and subsequently applied to the support 4. In particular, the exemplary embodiments of FIGS. 8, 10 and 11 can be transferred analogously to FIGS. 17 and 18. Furthermore, unlike drawn in FIGS. 17 and 18 and as possible in all other exemplary embodiments, there can be a plurality of the coupling-out elements 3.

Such semiconductor light sources 1, as shown in conjunction with FIGS. 17 and 18, can be large-area light sources with a directed radiation and can serve, for example, as a replacement of lamps, for example, in general lighting.

Figure 19:
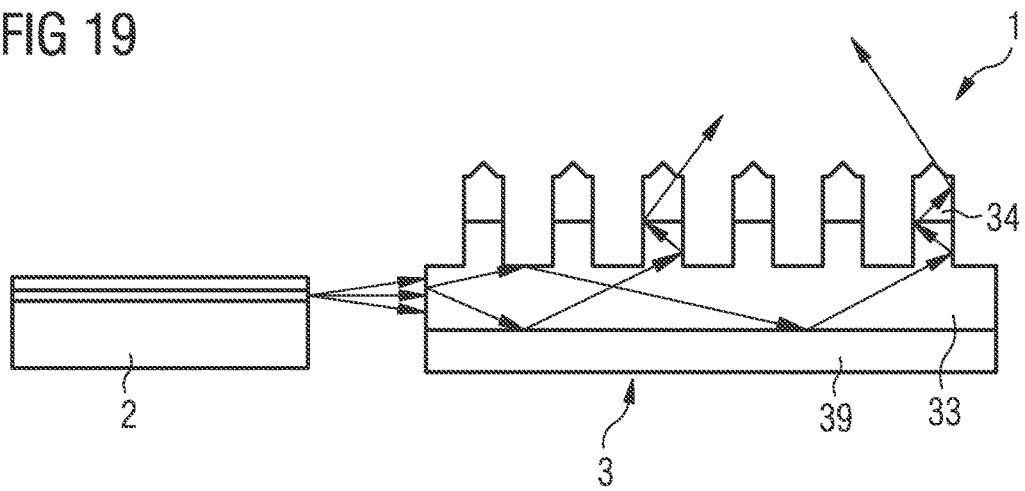

In the exemplary embodiment of FIG. 19, the light guide columns 34 are only partly made of the same material as the base region 33. When producing these light guide columns 34, a structuring can thus be introduced into an original material for the base region 33. A transition of said material of the base region 33 to the further material of the light guide columns 34 is preferably carried out smoothly, so that no edge, ridge, groove or unevenness occurs in a transition region between the materials.

Figure 20:
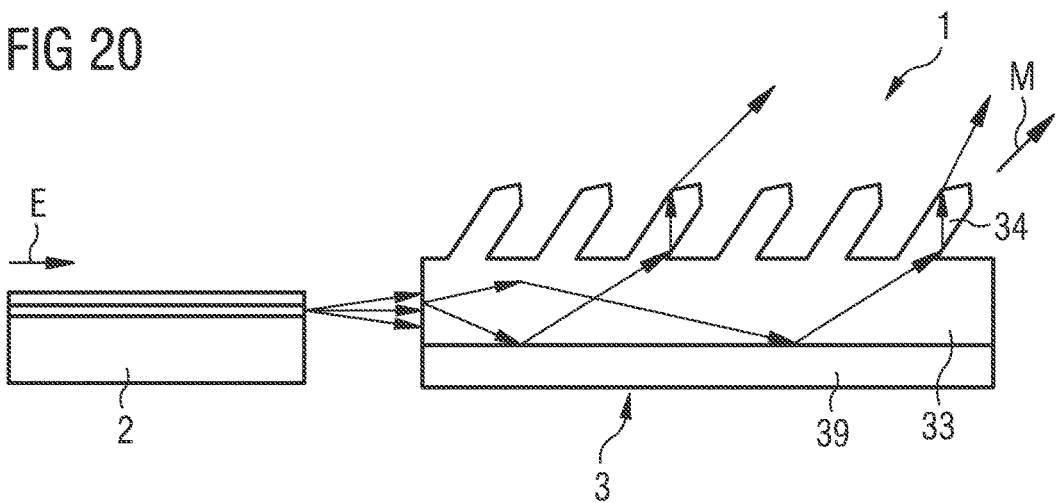

FIG. 20 shows that the light guide columns 34 are oriented obliquely to the base region 33. Thus, the irradiation direction E is also oriented obliquely to the main emission direction M. In this case, the main emission direction M runs parallel to the longitudinal axes of the light guide columns 34.

Figure 21A:
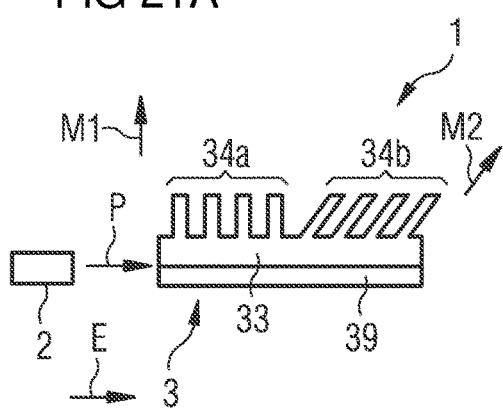
Figure 21B:
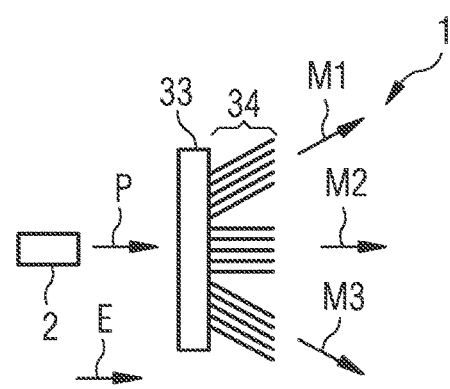

According to FIGS. 21A and 21B, two or even more regions with light guide columns 34, 34a, 34b are shown, which point in different directions. As a result, the emission characteristic can be set variably and a plurality of main emission directions M1, M2, M3 can be present. In this case, the irradiation direction E can be parallel, as in FIG. 21A, or perpendicular, as in FIG. 21B, or can also be oriented obliquely to the longitudinal axis of the base region 33, other than shown.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A semiconductor light source comprising:
at least one semiconductor laser configured to generate a primary radiation; and
at least one coupling-out element comprising a continuous base region and rigid light guide columns extending away from the base region, the light guide columns configured to act as waveguides for the primary radiation,
wherein the primary radiation is irradiated into the base region during operation, is led through the base region to the light guide columns and is directionally emitted from the light guide columns so that an intensity half-value angle of the emitted primary radiation is at most 90°,
wherein a ratio of a mean height and an average diameter of the light guide columns is at least 3,
wherein a main beam direction of the semiconductor light source is perpendicular to a longitudinal axis of the base region and parallel to longitudinal axes of the light guide columns,
wherein the primary radiation is irradiated parallel to the longitudinal axis of the base region so that a main emission direction is oriented perpendicular to an irradiation direction, in each case with a tolerance of at most 15°, and
wherein the base region and the light guide columns comprise one or more semiconductor materials.

2. The semiconductor light source according to claim 1, wherein the base region is formed as a straight or a curved rod, and
wherein the light guide columns are arranged around the longitudinal axis of the base region.

3. The semiconductor light source according to claim 1, wherein, on a bottom face of the base region, facing away from the light guide columns, a roughening for scattering of the primary radiation is formed, and
wherein the base region is plate-shaped and a structure density of the roughening increases monotonically in a direction away from the semiconductor laser.

4. The semiconductor light source according to claim 1, wherein, in a direction away from the base region, tips of the light guide columns narrow and, as seen in cross section, are formed as a trapezoid, a triangle, a semi-circle, a stepped pyramid, a parabola or a hyperbola, so that the tips act as a converging lens for the primary radiation.

5. The semiconductor light source according to claim 1, wherein a region between the light guide columns or at the base region is partially or completely filled by a liquid or solid material having a low refractive index relative to the light guide columns, so that said material serves as a cladding layer for the light guide columns.

6. The semiconductor light source according to claim 1, further comprising a cladding layer located on a bottom face of the base region, the bottom face lying opposite the light guide columns and comprising a material having a low refractive index relative to the base region in order to facilitate waveguiding in the base region, wherein the base region and the light guide columns consist essentially of one semiconductor material and are grown epitaxially, and wherein the cladding layer comprises a plurality of the following materials: Al, Ga, In, Mg, Si, N, or SiC.

7. The semiconductor light source according to claim 1, wherein the base region or the light guide columns consist essentially of a plurality of semiconductor materials.

8. The semiconductor light source according to claim 1, wherein the semiconductor laser and the coupling-out element are monolithically integrated and are at least partly based on the same material system.

9. The semiconductor light source according to claim 1, wherein the semiconductor light source comprises a plurality of the semiconductor lasers arranged in a common plane, wherein the semiconductor lasers irradiate the primary radiation with incidence directions oriented obliquely to one another into the coupling-out element during operation, and wherein at least two of the semiconductor lasers emit colors different from each other.

10. The semiconductor light source according to claim 1, wherein an average diameter of the light guide columns is between 0.5 µm and 20 µm inclusive, and a ratio of the mean height and an average diameter is between 3 and 26 inclusive.

11. The semiconductor light source according to claim 1, wherein an emission surface of the semiconductor laser is smaller by at least a factor of 1000 than an emission surface of the coupling-out element.

12. The semiconductor light source according to claim 1, wherein at least one phosphor is arranged between the light guide columns or disposed on the light guide columns, the phosphor being designed for partially or completely converting the primary radiation into a longer-wavelength secondary radiation.

13. The semiconductor light source according to claim 1, wherein the semiconductor laser comprises a semiconductor layer sequence from the following material system $Al_n In_{1-n-m} Ga_m N$, and wherein the base region of the coupling-out element comprises the same material system.

14. A semiconductor light source comprising:
at least one semiconductor laser for generating a primary radiation; and
at least one coupling-out element comprising a continuous base region and rigid light guide columns extending away from the base region, the light guide columns configured to act as waveguides for the primary radiation,
wherein the primary radiation is irradiated into the base region during operation, is led through the base region to the light guide columns and is directionally emitted from the light guide columns so that an intensity half-value angle of the emitted primary radiation is at most 90°, and wherein the base region and the light guide columns comprise one or more semiconductor materials.

15. The semiconductor light source according to claim 14, wherein the primary radiation is irradiated and emitted parallel to longitudinal axes of at least one part of the light guide columns so that an irradiation direction of the primary radiation is oriented perpendicular to a longitudinal axis of the base region, in each case with a tolerance of at most 15°.

16. The semiconductor light source according to claim 14,
wherein the primary radiation is irradiated obliquely to longitudinal axes of at least one part of the light guide columns and is emitted parallel to the longitudinal axes, with a tolerance of at most 15°, and wherein the longitudinal axes of the light guide columns are oriented at an angle of between 35° and 65° inclusive to a longitudinal axis of the base region.

17. The semiconductor light source according to claim 14,
wherein a main beam direction is perpendicular to a longitudinal axis of the base region and parallel to longitudinal axes of at least one part of the light guide columns, and wherein the primary radiation is irradiated parallel to the longitudinal axis of the base region so that a main emission direction is oriented perpendicular to an irradiation direction, in each case with a tolerance of at most 15°.

18. A semiconductor light source comprising:
at least one semiconductor laser configured to generate a primary radiation; and
at least one coupling-out element comprising a continuous base region and rigid light guide columns extending away from the base region, the light guide columns configured to act as waveguides for the primary radiation, wherein the primary radiation is irradiated into the base region during operation, is led through the base region to the light guide columns and is directionally emitted from the light guide columns so that an intensity half-value angle of the emitted primary radiation is at most 90°, wherein a ratio of a mean height and an average diameter of the light guide columns is at least 3, wherein a main beam direction of the semiconductor light source is perpendicular to a longitudinal axis of the base region and parallel to longitudinal axes of the light guide columns, wherein the primary radiation is irradiated parallel to the longitudinal axis of the base region so that a main emission direction is oriented perpendicular to an irradiation direction, in each case with a tolerance of at most 15°, wherein the base region and the light guide columns comprise one or more semiconductor materials, wherein there is no gap between the base region and the light guide columns, wherein a gap is provided between the semiconductor laser and the coupling-out element, wherein a cladding layer is provided on side faces of the light guide columns, and wherein the light guide columns comprise tips that taper in a direction away from the base region on a side facing away from the base region.

* * * * *